Dec. 30, 1969 W. C. ROSVOLD 3,486,892

PREFERENTIAL ETCHING TECHNIQUE

Original Filed Jan. 13, 1966 2 Sheets-Sheet 1

INVENTOR
WARREN C. ROSVOLD

BY [signature]

AGENT

PREFERENTIAL ETCHING TECHNIQUE

ETCHING RATES VS TEMPERATURE

INVENTOR
WARREN C. ROSVOLD
BY [signature]
AGENT

United States Patent Office 3,486,892

Patented Dec. 30, 1969

3,486,892

PREFERENTIAL ETCHING TECHNIQUE

Warren C. Rosvold, Sunnyvale, Calif., assignor to Raytheon Company, Lexington, Mass., a corporation of Delaware Continuation of application Ser. No. 520,506, Jan. 13, 1966. This application Jan. 17, 1969, Ser. No. 805,077
Int. Cl. G03c *5/00*; H01l *7/68*
U.S. Cl. 96—36.2 10 Claims

ABSTRACT OF THE DISCLOSURE

A preferential etching technique useful in making electrically isolated integrated circuit devices in which a wafer of semiconductor material is masked with a layer of silicon dioxide which has a pattern of photoresist thereon. The wafer has a crystallographic axis aligned normal to its transverse, and the photoresist is in a pattern oriented with respect to the crystallographic axis of the wafer.

This application is a continuation of U.S. patent application Ser. No. 520,506, filed Jan. 13, 1966, entitled "Preferential Etching Technique."

This invention relates to a novel method of making semiconductor microcircuit devices and has particular reference to a novel chemical milling or preferential etching technique for physically separating and electrically isolating individual components in a microcircuit.

The prior art has utilized a family of etchants based upon hydrofluoric acid and nitric acid in varying concentrations which, with the addition of a suitable buffer, yield a great variety of etch rates and surface finishes. A questionable improvement thereof is provided by the utilization of a process such as taught by U.S. Patent 3,041,226 to P. R. Pennington which teaches etching a semiconductor crystal along the selected cleavage plane of the crystal after crystallographically damaging the crystal to the depth of the etched area.

However, most of the above-mentioned prior art methods possess drawbacks and limitations which obsolete them as effective methods for application to microcircuitry and small geometry components. For example, most acid etchants produce gross undercutting of the masking media and at best product a geometry twice as wide as it is deep. Furthermore, such methods indicate inability to produce high resolution geometries suitable for microcircuit application. Another drawback is that, as in Pennington's process, it was necessary to first damage the semiconductor such as by scribing in order to localize the etching area.

The present invention overcomes the above and other disadvantages of the prior art by the provision of a precise chemical milling technique, also known as a preferential etching technique, whereby a microcircuit formation of electrical or electronic semiconductor components and package substrates may be chemically milled to mechanically fit in precise locations in a circuit matrix. This invention produces high resolution channels for effective electrical isolation of critical areas in microcircuits and permits the production of precision multi-level geometries. No undesirable undercutting of masking media occurs and no prior damaging of the crystal is required.

These advantages are achieved in accordance with the present invention by utilization of a semiconductor crystal which is sliced along the selected cleavage plane from an ingot which has been suitably prepared by growing so as to orient the molecules in the required manner. Upon or in the crystal are provided the electronic component areas to be isolated. The electronic components within the areas may be formed either before or after the preferential etching separation step of this invention. Such etching comprises subjecting the area or areas of the semiconductor material to be etched wtih a solution of sodium hydroxide through openings in a silicon dioxide mask, the semiconductor material being oriented with respect to the oxide masking thereon as to permit etching to take place along the selected cleavage plane or crystallographic axis of the crystal.

With this method, greater detail of which will be set forth hereinafter, there results substantially no undercutting of the masking media. Precisely shaped flat-bottom depressions are easily obtainable with great dimensional stability. Specialized geometries are obtainable and uniplanar walls may be produced with angular or inclined surfaces correspondent to the crystal orientation.

Other objects and advantages of this invention will become apparent from the following description taken in connection with the accompanying drawings, wherein.

Referring more particularly to the drawings wherein like characters of reference designate like parts throughout the several views, this invention will be described herein with reference to the production of a differential amplifier type of microcircuit embodying two transistors mounted on a common substrate and having matching electrical characteristics, as set forth in copending application Ser. No. 520,505, now Patent No. 3,423,651, assigned to the same assignee as the present invention.

Figure 1:
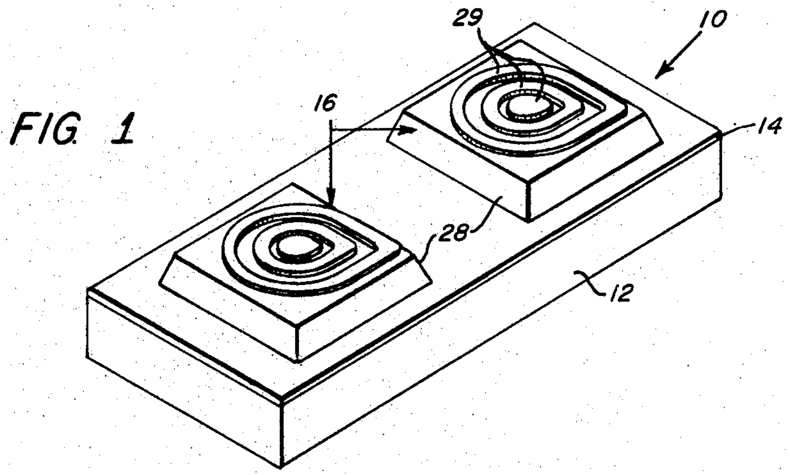
FIG. 1 is a perspective view of an integrated circuit differential amplifier formed in accordance with this invention.

It is desired, for the present example, to provide a differential amplifier in microcircuit or integrated circuit form by forming two transistors on a common substrate and electrically isolating the transistors by utilization of the method of the present invention. However, it is to be understood that other microcircuit applications may utilize the invention and that the amplifier shown in FIG. 1 is illustrative only.

Figure 2:
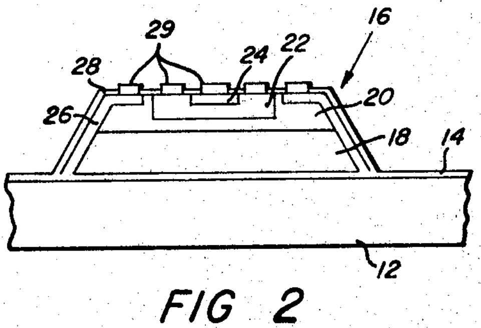
FIG. 2 is an enlarged vertical sectional view through a portion of one of the transistors of the device of FIG. 1.

The amplifier 10 comprises a support layer 12 comprised of polycrystal silicon upon which is a layer 14 of silicon dioxide. Upon the oxide layer are located two or more separate transistors 16, each of which in this example comprises a layer 18 of N+ type single crystal silicon (FIG. 2) upon which is deposited an epitaxially grown N layer 20. Into the N layer 20 is diffused a P− type base region 22, and an emitter electrode 24 of N type is diffused into the layer 22. A collector electrode 26 is also provided encircling the N and N+ regions 18 and 20 and overlying a portion of the top surface of the transistor as shown. A protective coating 28 covers the top and sides of each transistor except in the areas where contacts 29 are made for connection of the electrodes to sources of bias. Since the device structure in and of itself does not constitute the present invention, reference is made here to the aforementioned copending application Ser. No. 520,505, now Patent No. 3,423,651, for further details thereof.

In accordance with this example of the invention, the transistors 16, or other components, are formed from a single layer 18 (FIG. 3) of single crystal silicon which is oriented with its [100] crystallographic plane aligned with its transverse plane, that is, its upper and lower surfaces. The wafer 18 is sliced from an ingot 19 (FIG. 4) grown from a seed in the usual manner of known crystal growing techniques, with the initial seed from which the ingot is being grown being properly oriented as to its own particular axes so that the molecules of the ingot will be properly oriented during crystal growth whereby the ingot may be easily sliced transverse to its longitudinal axis in order to produce therefrom a number of wafers 18 all having the [100] crystal plane orientation, as illustrated in FIG. 4.

Figure 3:
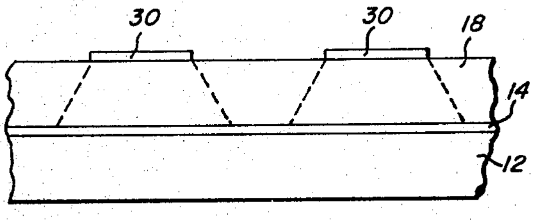
FIGS. 3, 4 and 5 are diagrammatic illustrations of a device being manufactured at various stages during its manufacture.
Figure 4:
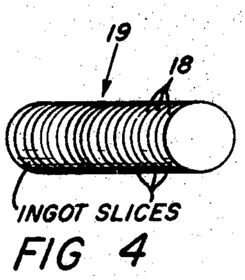

The wafer 18 of FIG. 3 is to be separated into two separate electrically isolated components or elements in accordance with this invention, which components must be of a precise shape or configuration whereby the resulting regions therein will have desired electrical characteristics. To achieve this, wafer 18 is mounted upon a polycrystalline layer 12 with a separating layer 14 of silicon dioxide therebetween.

At this point, the surfaces of the crystal or wafer 18 are masked with silicon dioxide in a pattern which determines the shapes of the components to be separated. This is done by utilizing well-known photoresist masking techniques. It is important that this masking be so oriented upon the crystal surface that etching will occur along the [100] crystallographic axes or cleavage planes of the crystal. Briefly, this masking technique comprises first forming a silicon dioxide layer over the entire surface of at least the crystal layer 18, this being done by any of the known thermal growing or other oxidation techniques to form the oxide layer to the desired thickness. Then the crystal is coated with a photoresist material, such as the ultraviolet sensitive material sold by the name KPR by Eastman-Kodak Company, this photoresist material overlying the silicon dioxide coating on the crystal. The photoresist material is then exposed to ultra-violet radiation, or other radiation to which the selected photoresist material is sensitive, through a photographic film negative which bears the selected pattern of the electronic component layout to be formed. This exposure sensitizes portions of the photoresist material and thereafter the material is developed by dipping the wafer in a solution such as trichloroethylene to remove unsensitized photoresist material. The photoresist material at this point covers only those areas of the crystal where the transistors 16 are to be located. This material is then baked at about 150° C. for about ten minutes to harden the remaining photoresist mask.

The wafer then is placed in a solution containing about one part hydrofluoric acid (HF) and nine parts ammonium fluoride ($NH_4F$) to etch away the uncovered areas of silicon dioxide, following which it is rinsed in water and dried. At this point the remaining silicon dioxide defines the areas of the transistors, so the remaining photoresist material may be either removed or permitted to remain for later automatic removal during the following mesa etching process. The structure at this point appears as shown in FIG. 3 wherein the silicon dioxide mask is indicated by numeral 30.

To etch the mesas which are to eventually become the resultant transistors, the wafer is mounted, as by a wax bond, with the pattern side up on a glass slide, placed in a suitable rack, preheated in boiling water to the temperature of the etching solution, that is, about 115° C.

The etching solution is a saturated solution of sodium hydroxide (NaOH) in water. Saturation for etching purposes occurs with at least 25% of the mixture being NaOH. For best results the solution should contain about 33% NaOH to compensate for dilution or other weakening of the etchant during the etching process. The preheated wafer is subjected to the etchant for the time necessary to etch the mesas to remove the single crystal silicon material down to the silicon dioxide layer 14. This etching occurs automatically along the [100] crystallographic axes of the crystal which, as stated above, are aligned with the mask. By so aligning the mask with the crystal planes, the desired geometry of the etched structure results. There will be produced mesas 32 (FIG. 5) having slanted sides and separated by a flat-bottom depression as shown.

In accordance with this invention, it has been found that with the silicon dioxide mask aligned within about 5 degrees of the crystal planes a structure can be formed having linear walls with a deviation of about thirty degrees from perpendicular.

The silicon dioxide mask 30 and layer 14 are not substantially affected by sodium hydroxide and, consequently silicon dioxide is especially suitable for the purpose. It was found also that the silicon dioxide mask areas 30 were not undercut to any substantial degree, such undercutting being less than 2 microns per 25 microns of depth.

Figure 5:
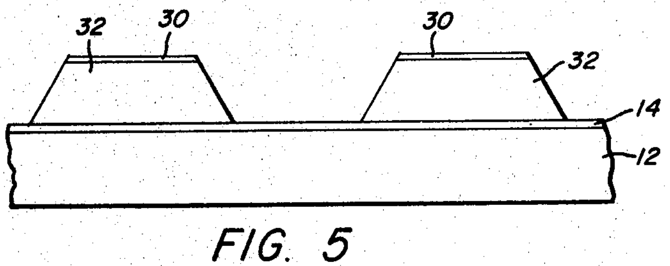
Figure 6:
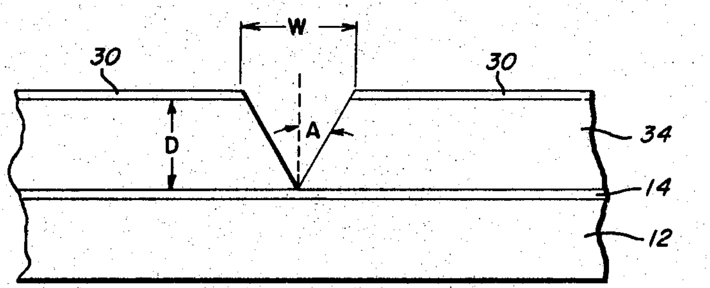
FIG. 6 is a diagrammatic illustration of a modified etched configuration.

FIG. 6 shows diagrammatically how a crystal 34 of silicon may be provided with a slant-sided depression having a pointed apex at its bottom, as opposed to a flat-bottomed depression as shown in FIG. 5.

Knowing that the materials and processes described above may be successfully employed, depth of a depression may be readily controlled. For example, with a width W equal to 1, and knowing that angle A is 30°, then TAN 30° = ½ $W/D$.

$$D=\frac{W}{2\ \mathrm{TAN}\ 30^\circ}=\frac{1}{1.16}=.86$$

Therefore, the depth, in the above example, will be 0.86 inch.

From the above, it will be apparent that very precise shapes and configurations may be obtained by etching along the selected crystallographic axes of a silicon crystal to produce depressions, for example, which will intimately interfit with portions of other circuit components if desired.

Figure 7:
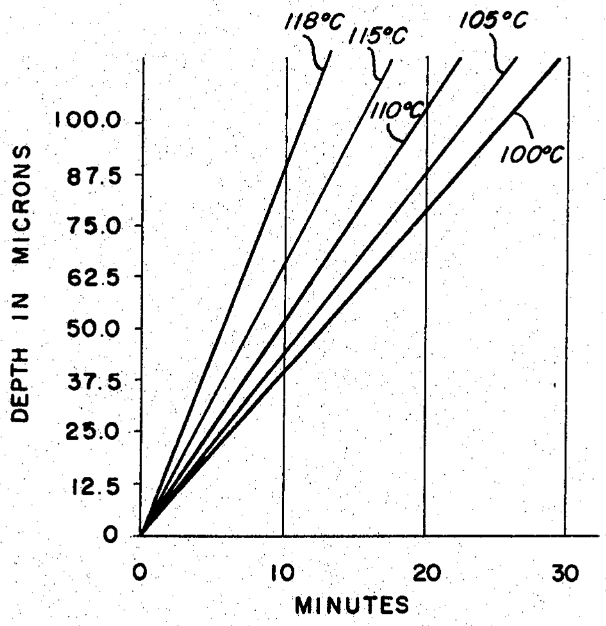
FIG. 7 is a chart illustrating variations in etching depth with changes in the time-temperature cycles.

It will be apparent from the chart in FIG. 7, however, that the time and temperature cycles may be varied somewhat to produce predetermined etching depths, increases in either time or temperature, or both, resulting in increase in etching depth.

To complete the process, the device is removed from the etching solution at the conclusion of the selected time interval and is rinsed in deionized water and any remaining NaOH is neutralized by a solution of acetic acid, followed by final rinsing and drying. The mesas are then provided with the electrodes by conventional and well-known diffusing techniques, if this has not already been done. Also, if metallized contacts for the electrodes have not already been provided, this also may be done at this time by well-known metallizing techniques. Electrode forming and metallizing techniques are also set forth in the aforementioned copending application.

From the foregoing it will be apparent that a novel preferential etching technique has been described for etching along a [100] crystallographic axis to form a particular geometry. It is to be understood, however, that other crystal orientations may be utilized in the presently described process in order to produce other selected geometries, if desired.

It will be apparent that all of the objectives and advantages of this invention have been achieved by the novel etching method described. It is also to be understood, however, that various modifications and changes therein may be made by those skilled in the art without departing from the spirit of the invention as expressed in the accompanying claims.

What is claimed is:

1. A method of making electrically isolated integrated circuit devices, comprising the steps of forming a wafer of single crystal silicon with a selected crystallographic axis aligned normal to its transverse plane, mounting the wafer upon a support of dielectric material, masking a surface of the wafer with a layer of silicon dioxide insulating material having superimposed thereon a layer of photoresist in a pattern which determines the shapes of component areas to be formed in the wafer and which is oriented with respect to the selected crystallographic axis of the wafer, etching the wafer in the unmasked areas along the selected crystallographic axes thereof and completely through the wafer to the dielectric material to provide spaced electrically isolated component areas, and providing the areas with electrodes.

2. The method set forth in claim 1 wherein the step of mounting the wafer upon a support of dielectric material comprises providing a surface of the wafer with a layer of silicon dioxide and disposing upon said silicon dioxide layer a layer of polycrystalline silicon.

3. The method set forth in claim 1 wherein the step of masking a surface of the wafer with an insulating material comprises depositing a layer of silicon dioxide on the surface of the wafer, coating the silicon dioxide layer with photoresist material, exposing the photoresist material to radiation to which it is sensitive and in a pattern which determines the shapes of component areas to be formed and which is oriented with respect to the selected crystallographic axis of the wafer, developing and hardening the exposed photoresist material to retain said material only in said pattern areas, and removing exposed silicon dioxide to bare the wafer surfaces to be subsequently etched.

4. The method set forth in claim 1 wherein the etching step comprises subjecting the wafer to a heated solution of sodium hydroxide in water for a time interval sufficient to remove the single crystal silicon wafer material down to the dielectric material.

5. The method set forth in claim 4 wherein said solution comprises at least 25% of sodium hydroxide.

6. The method set forth in claim 4 wherein said solution comprises about 33% of sodium hydroxide.

7. The method set forth in claim 4 wherein the etching step is preceded by the step of preheating the wafer to about the temperature of the etching solution.

8. The method set forth in claim 1 wherein the step of providing the areas with electrodes precedes said masking and etching steps.

9. The method set forth in claim 1 wherein the masking is oriented with the [100] crystallographic axis of the wafer.

10. A method of making a semiconductor device, comprising the steps of forming a wafer of single crystal semiconductor material with a selected crystallographic axis aligned normal to its transverse plane, masking a surface of the wafer with a material inert to the etching solution to be used having superimposed thereon a layer of photoresist in a pattern which determines the shape of at least one component area to be formed in the wafer and which is oriented with respect to the selected crystallographic axis of the wafer, etching the wafer in the unmasked areas along the selected crystallographic axes thereof and completely through the wafer to separate the component area, and providing the area with electrodes.

References Cited

UNITED STATES PATENTS

| | | | |
|---|---|---|---|
| 3,041,226 | 6/1962 | Pennington | 156—17 |
| 3,425,879 | 2/1969 | Shaw et al. | 156—17 |

FOREIGN PATENTS

| | | |
|---|---|---|
| 725,412 | 3/1955 | Great Britain. |

NORMAN G. TORCHIN, Primary Examiner

J. R. HIGHTOWER, Assistant Examiner

U.S. Cl. X.R.

29—577, 578; 156—7, 17